United States Patent [19]

Engeler et al.

[11] Patent Number: 5,122,732
[45] Date of Patent: Jun. 16, 1992

[54] MULTI-RATE SUPERRESOLUTION TIME SERIES SPECTRUM ANALYZER

[75] Inventors: William E. Engeler, Scotia; Seth D. Silverstein, Schenectady, both of N.Y.

[73] Assignee: General Electric Company, Schenectady, N.Y.

[21] Appl. No.: 656,904

[22] Filed: Feb. 19, 1991

[51] Int. Cl.$^5$ .............................................. G06F 15/31
[52] U.S. Cl. ............................. 324/77 E; 324/77 G; 324/78 F; 324/78 D; 324/724.10; 342/14; 342/20; 342/16
[58] Field of Search .............. 333/166, 167, 173, 175; 342/18, 14, 20; 364/724.10, 724.06, 484, 485; 324/77 E, 77 G, 78 F, 77 D

[56] References Cited

U.S. PATENT DOCUMENTS

| | | | |
|---|---|---|---|
| 4,737,713 | 4/1988 | Danby | 324/77 E |
| 4,908,787 | 3/1990 | Dyer | 364/724.01 |
| 4,961,160 | 10/1990 | Sato | 364/724.01 |
| 4,996,528 | 2/1991 | Asghar | 364/724.01 |

OTHER PUBLICATIONS

R. W. Schafer and L. R. Rabiner, "A Digital Signal Processing Approach to Interpolation," Proc. IEEE, Jun. 1973, vol. 61, pp. 692-702.

S. D. Silverstein and J. M. Pimbley, "Robust Spectral Estimation: Autocorrelation Based Minimum Free Energy Method," 22nd Asilomar Conference on Signals, Systems and Computers, Nov. 1988.

S. D. Silverstein S. M. Carroll, and J. M. Pimbley, "Performance Comparisons of the Minimum Free Energy Algorithms with the Reduced Rank Modified Covariance Eigenanalysis Algorithm," Proc. ICASSP, Glasgow, Scotland, U.K. May 1989.

R. O. Schmidt, "Multiple Emitter Location and Signal Parameter Estimation," IEEE Trans. Antennas and Propagation, Mar. 1986, vol. AP-34, pp. 276-280.

D. W. Tufts and R. Kumaresan, "Estimation of Frequencies of Multiple Sinusoids: Making Linear Prediction Perform Like Maximum Likelihood," Proc. IEEE, Sep. 1982, vol. 70, pp. 975-989.

R. Roy, A. Paulraj and T. Kailath, "ESPRIT—A Subspace Rotational Approach to Estimation of Parameters of Cisoids in Noise," IEEE Trans. on ASSP, Oct. 1986, vol. 34, pp. 1340-1342.

Primary Examiner—Kenneth A. Wieder
Assistant Examiner—Jose M. Solis
Attorney, Agent, or Firm—Lawrence P. Zale; James C. Davis, Jr.; Marvin Snyder

[57] ABSTRACT

Parallel architectures preprocesses large matrices from sampled coherent time apertures receiving signals from distant sources to produce lower order matrices, derived from pseudo coherent time apertures, which are computationally less burdensome. The large matrices are processed by frequency shifting, low pass filtering with an FIR filter, and executing front-end decimation to create the pseudo coherent time apertures, each corresponding to different subbands of the temporal frequency spectrum. The signals representing the pseudo coherent time apertures are processed using matrix based superresolution spectral estimation algorithms such as the Tufts-Kumaresan (T-K) reduced rank modified covariance algorithm and the Linear Minimum Free Energy algorithms to produce an image of the sources.

2 Claims, 12 Drawing Sheets

MULTI-RATE SUPERRESOLUTION TIME SERIES SPECTRUM ANALYZER

CROSS REFERENCES TO RELATED APPLICATIONS

Reference is made to related application "A SUPERRESOLUTION BEAMFORMER FOR LARGE ORDER PHASED ARRAY SYSTEM" Seth David Silverstein and William Ernest Engeler, Ser. No. 07/656,882 filed Feb. 19, 1991, and also assigned to the present assignee.

BACKGROUND OF THE INVENTION

1. Field of the Invention

The present invention relates to a coherent sampled time series and more specifically to a parallel architecture implementation of a digital sampled time series for superresolution temporal spectral estimation.

2. Description of Related Art

A uniformly sampled time series consists of discrete digital samples of a signal. The time series information can be represented by a large data vector. The large data vectors are accumulated in large order matrix arrays that are manipulated in order to produce solutions. In the case of a radar doppler detection system, the solution representing a frequency peak due to a moving target can be represented by spectral scan that can be constructed and exhibited on a display screen. In order to produce finer frequency resolution, a longer coherent time aperture with more samples are used. This results in the larger size matrix arrays to be solved. The computation time required to implement superresolution spectrum analysis with an array of x samples is usually proportional to $x^3$. This means that doubling the number of sensors increases the computation by a factor of eight.

There are a number of techniques which are used to avoid large matrix problems. Unfortunately, most of these approaches compromise the potential frequency resolution of the system. An example would be the division of a large coherent time aperture into non-overlapping smaller coherent time apertures. These subapertures are represented by small matrix arrays, each with sample orders that are small enough to make matrix operations feasible. However, this procedure reduces the Rayleigh resolution to that of the shorter length subapertures corresponding to the smaller matrix arrays. (The Rayleigh frequency resolution is equal to the reciprocal of the coherent integration time of the aperture.)

Another technique involves autoregressive parametric analysis. This involves the reduction of the order of parametric models to levels small enough to suppress instabilities. The arithmetic instabilities which are manifested in spurious peaks are caused by large noise induced fluctuations in the small eigenvalues of the autocorrelation matrices. These methods also significantly degrade resolution.

The problem to be solved is to obtain high, sub-Rayleigh frequency resolution at moderately low SNR scenarios when the sample orders of the coherent time apertures are too large for matrix based superresolution methods to be practicable. Here the number of samples in the coherent time aperture represent both the order of the time series array and also the order of the covariance matrices which are computed from the complex sample data.

There is an extensive prior art associated with multi-rate signal processing architectures as they apply to voice coding (See "A Digital Signal Processing Approach to Interpolation", R. W. Schafer and L. R. Rabiner, Proc. IEEE, Vol. 61, pp. 692-702, June 1973). The generic architecture for the multirate preprocessor of the superresolution systems consists of sequential operations involving the combination of filtering, base band modulation, and decimation which provides a division of the temporal frequency spectrum into spectral subbands. Different architectures which basically accomplish the same end effect correspond to permutations of the order of the signal processing operations.

Superresolution algorithms and their associated architectural embodiments are the class of architectures that produce sub-Rayleigh frequency resolution. Superresolution is often expedited using some form of a matrix approach based upon covariance matrices computed from the elemental complex data for the sampled time series array. Difficulties often occur when the order of the matrices are large, say greater than ~32. Large matrices are computationally burdensome, and moreover are susceptible to instability problems associated with potential ill-conditioning.

There is a need for an architecture that employs temporal spectral subbanding techniques for the specific purpose of creating effective lower element order pseudo-time series arrays which can be processed in parallel in a matrix based superresolution algorithm/architecture without sacrificing resolution.

SUMMARY OF THE INVENTION

A superresolution spectrum analyzer of the type set forth in this invention that is used for preprocessing coherent time aperture data employs a number of parallel branches, each branch having a modulator, a low pass filter, a decimator, and an output. The modulator in each branch receives the data from the coherent aperture and shifts the signal by a predetermined value which differs for each branch. The output of each modulator is low pass filtered, and then the number of samples is reduced by its corresponding decimator. The output of each branch is then sent to a plurality of superresolution analyzers used in reconstructing the signal from the coherent aperture.

The present invention employs spectral subbanding techniques for creating lower element order time series arrays, called pseudo-arrays that can be processed to give the spectrums in commensurate subbands. The pseudo-time series arrays are created from the time series signals by executing single sideband modulation of the samples, low pass filtering, and decimation. The parallel architecture of the present invention preserves the potential resolution of the full coherent aperture while making superresolution techniques practicable. In an alternate embodiment of the present invention, modulation is performed after low pass filtering and decimating. In still another embodiment, a windowing element and Fast Fourier Transform (FFT) perform the low pass filtering, and decimation is produced by selectively passing the outputs of the FFT element to a number of Inverse Fast Fourier Transform (IFFT) elements, with the Inverse FFT elements performing the demodulation of the signal. The use of additional windowing elements produces the presently preferred embodiment of the invention.

OBJECTS OF THE INVENTION

It is an object of the present invention to provide a means for dividing an array of time series samples representing a large coherent time aperture into a series of smaller matrix arrays each representing temporal frequency subbands. The subbands can be either contiguous, or preferentially arranged with overlap, to eliminate end effects at subband boundaries. The individual pseudo-time series representing the subbands can all be processed in parallel.

It is another object of the present invention to provide a means for dividing a long coherent time aperture into many effective pseudo-time series arrays with orders which are small enough to make the matrix analyses feasible.

It is an another object of the present invention to provide a means for dividing the effective replacement of a single sampled large order coherent time aperture by a number of pseudo-time apertures each of which have the same effective overall time extent of the original large time series array but have sample orders sufficiently reduced to make the necessary matrix operations practicable, each pseudo-time series corresponding to a different subband of the temporal frequency spectrum.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings(s) in which:

DETAILED DESCRIPTION OF THE PREFERRED EMBODIMENT

U.S. Pat. No. 4,982,150 Silverstein and Pimbley issued Jan. 1, 1991, assigned to the present assignee, is hereby incorporated by reference and made part of this disclosure.

The present invention employs parallel architectures for implementing matrix based superresolution spectral estimation algorithms for situations that require high levels of resolution commensurate with large coherent time apertures and large sample orders. Algorithms involving large order matrices are computationally burdensome and often suffer from stability problems associated with ill-conditioning. The parallel architectures of the present invention preserve the potential Rayleigh frequency resolution of the full aperture, and reduce matrix orders to levels where calculations are feasible.

The architectures of the present invention are based upon an application of the sampling theorem to coherent time apertures. Consider a signal that encompasses a subband from frequencies $[f_a, f_b]$. After modulation, this subband can be centered at zero frequency with a baseband bandwidth $B = f_b - f_a$. To prevent aliasing, a signal of baseband bandwidth B must be sampled at a rate greater than the Nyquist rate. This corresponds to the requirement that the reciprocal of the time separation between the samples $T_s$ must be greater than the baseband bandwidth. That is, $1/T_s \geq B$.

The system is designed specifically to obtain sub-Rayleigh temporal frequency resolution from data obtained from sampled coherent apertures which involve relatively large numbers of time samples. The present invention provides parallel system architecture that allows the implementation of the matrix based superresolution algorithms even though the order of the coherent time apertures are too large for the matrix based superresolution algorithms to be practicable.

Consider a uniformly sampled coherent time aperture consisting of N complex samples, $\{x(n)\}$, each separated by the time interval $T_s$, where n is the index number of the signal sample. The total time length of the coherent aperture is $NT_s$, and the Rayleigh frequency resolution is $1/T_sN$.

By filtering, the spectrum can be divided up into K subbands of equal bandwidth. The filtering operation gives K sets of signals $\{y_1(n)\}$ (all of order N). The pseudosets coherent time apertures corresponding to the subbands can be sampled at uniform sampling intervals $T_s \rightarrow T_sK$, which corresponds to a decimation of the number of samples from N to $N/K = Q$ samples. The decimated pseudo coherent time series which describe the subband spectra are uniformly sampled with sampling intervals equal $T_sK$. Each of the pseudo-coherent time series arrays covers the same total length as the original coherent aperture, $T_sKQ = T_sN$, which implies that the subband Rayleigh resolution is unchanged from that of the original large coherent time series. All these processes are performed in parallel on each of the subbands and the results fed in parallel into a bank of superresolution processors. These pseudo coherent time apertures now have sample orders that are sufficiently reduced to make the necessary matrix operations practicable.

Figure 2:
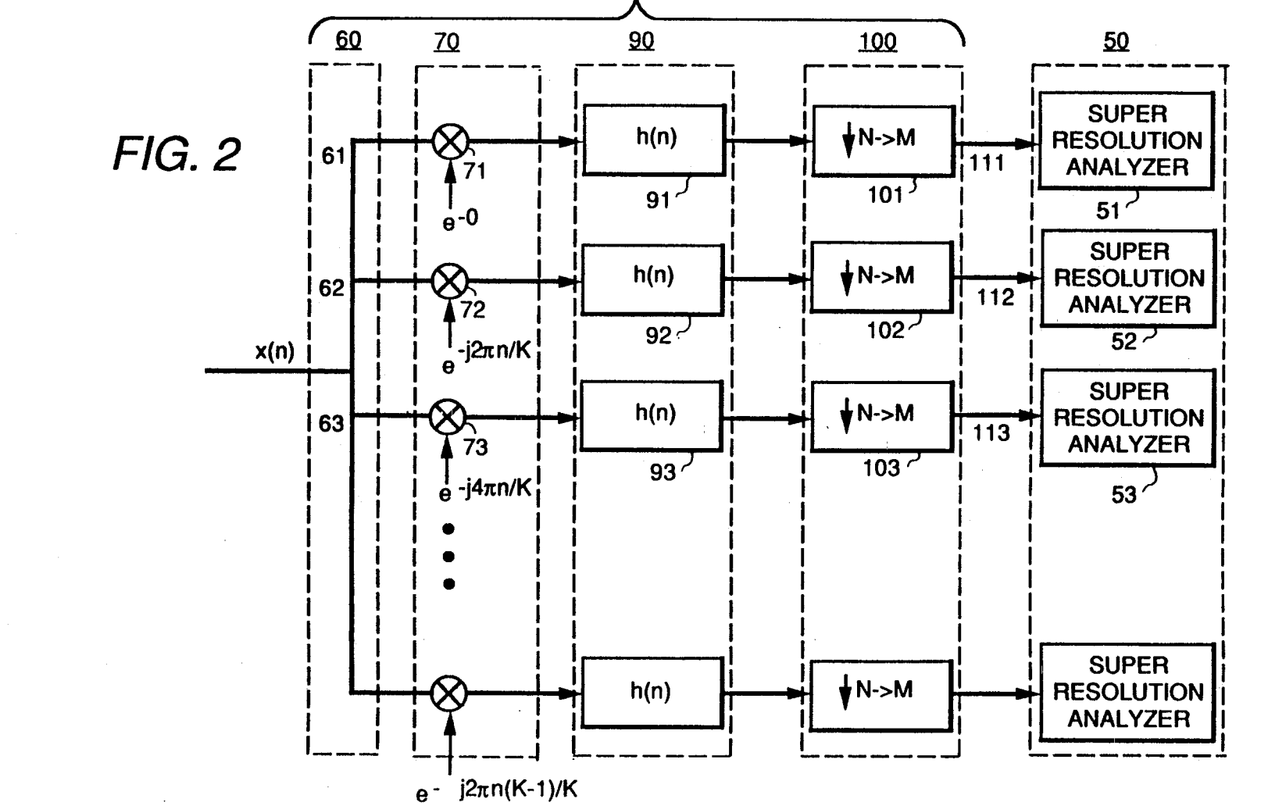
FIG. 2 is a partial block diagram of a first embodiment of the present invention.

FIG. 2 shows the large array of N complex samples x(n) being fed to the present invention having two subsystems consisting of a front-end processor stage 40 and a superresolution processor stage 50. The front-end processor stage 40 divides the system into a number of effective pseudo time series arrays passing through output lines 111, 112, 113, each of which arrays have the same overall length as the original large order time series array but have fewer samples.

Figure 1:
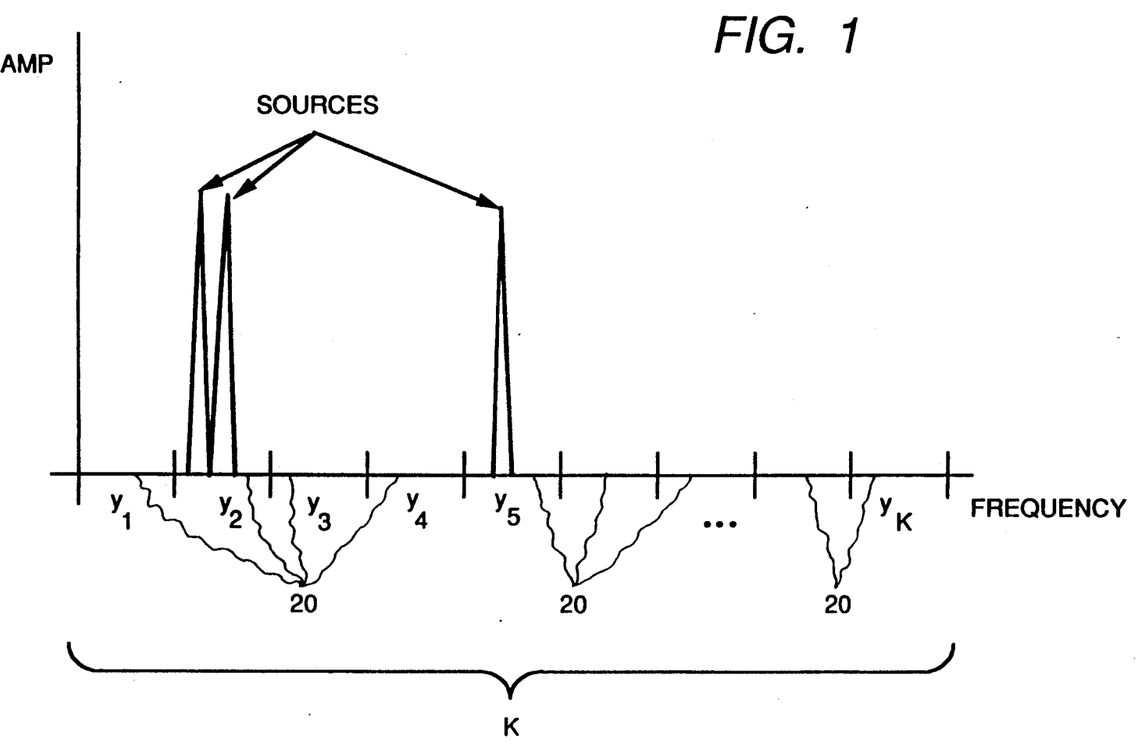
FIG. 1 illustrates division of the signal received from a coherent aperture into a plurality of subbands with each subband e.g. the ith, represented by an N dimensional data vector $Y_i$.

The front-end processor stage 40 divides the first Nyquist interval of the full spectrum into K contiguous subbands (20 of FIG. 1). All these subbands have equal bandwidths $1/KT_s$. This is accomplished by feeding parallel branches 60 from large array x(n) through branches 61, 62 and 63 to modulator 71, 72 and 73, respectively. Note that there are K branches of the present invention, but only four are shown in this illustration). The spectrum of the large array x(n) is single sideband modulated downward in frequency by modulators 70 by the uniformly spaced complex modulation factor, $$W_K^{-kn} = exp[-j2\pi kn/K], \text{ for } k=0, 1, 2, \ldots, K-1$$

Modulator 71 passes the original signal through $\pi$ being the ratio of the circumference of a circle to its diameter, and $j=\sqrt{-1}$. Modulator 72 multiplies the signal by a factor of $exp[-j2\pi n/K]$. Modulator 73 multiplies the signal by $exp[-j2\pi 2n/K]$.

The signal is then low pass filtered by finite impulse response (FIR) filters 90 with an impulse response function given by h(n). In this embodiment, all the subbands 20 are generated by low pass filters. The signal from modulator 71 is low pass filtered by filter 91. The signal from modulator 72 is low pass filtered by filter 92. The signal from modulator 73 is low pass filtered by filter 93. It should be noted that filters 91, 92 and 93 are identical, having an impulse response of h(n). The output signals of filters 91, 92 and 93 representing selective subbands of the original signal are fed to a decimator stage 100. The decimator stage 100 discards many of the samples in order to reduce the number of samples from N to M. Output signals of decimator 101 are fed to a superresolution analyzer 51. Output signals of decimator 102 are fed to superresolution analyzer 52, and similarly the output signals of decimator 103 are fed to superresolution analyzer 53.

For ideal low pass filters with passbands of spectral width $1/KT_s$, the uniform sample spacing can be extended from $T_s \rightarrow T_s K$. Filters are, of course, never ideal and to mitigate aliasing effects the filtered signals are usually oversampled. The sampling interval for the pseudo-time series becomes $T_s(K-\Delta)$ where $\Delta$ is an incrimental time sample spacing. By choosing $N/(K-\Delta)$ to be an integer M, this corresponds to decimating the original time series array consisting of N elements down to down to a pseudo-time series arrays consisting of M elements.

The order of the low pass FIR filters 90 cannot exceed the order of the original large coherent aperture. For these systems, the N point digital Fourier transform (DFT) low pass filter represents a near ideal choice. Consider the division of the spectrum into K contiguous spectral subbands The kth spectral subband will have a central frequency given by $f_k = k/K$. For an even number N, the subbands for $k > K/2$ correspond to the negative frequency sidebands contained within the first Nyquist interval. For special sideband reduction effects, the N point DFT tap weights can be modified by multiplicative tapering functions. The N point DFT of the modulated sequence for the kth spectral subband is given by $$X_k(q) = \sum_{n=0}^{N-1} e^{-j2\pi n(q/N+k/K)} x(n) \quad (2)$$

where q is the index of the output.

The filtered pseudo time series relevant to the kth spectral subband employs a selected P of these outputs. It is given by $$Z_k(m) = \frac{1}{N} \sum_{q=-P/2}^{+P/2-1} e^{j2\pi qm/N} X_k(q) \quad (3)$$

$$= \frac{1}{N} \sum_{n=0}^{N-1} x(n) e^{-j2\pi kn/K} e^{-j\pi(m-n)/N} \frac{\sin \pi(m-n)P/N}{\sin \pi(m-n)/N},$$

$$m = 0, 1, 2, \ldots, N-1$$

From this expression, we see that the impulse response function for the DFT low pass filter of spectral width $P/N = 1/K$ is given by $$h(n) = e^{-j\pi n/N} \frac{\sin \pi nP/N}{\sin \pi n/N} \quad (4)$$

Therefore the serial operations involving single sideband modulation, followed by low pass filtering, followed by decimation generates K different Mth order sequences $\{Z_k[m = pK], p=0,1,\ldots,M-1,\}$ which represent the complex signals from the different elements in the pseudo-coherent apertures. By choosing $M > P$, the aliasing effects from the sidebands of the DFT filters can be reduced. The preprocessor has effectively reduced the order of the coherent temporal arrays down to a level $N \rightarrow M$ where the matrix operations required for the superresolution stage of the spectrum analyzer are no practicable.

Figure 3:
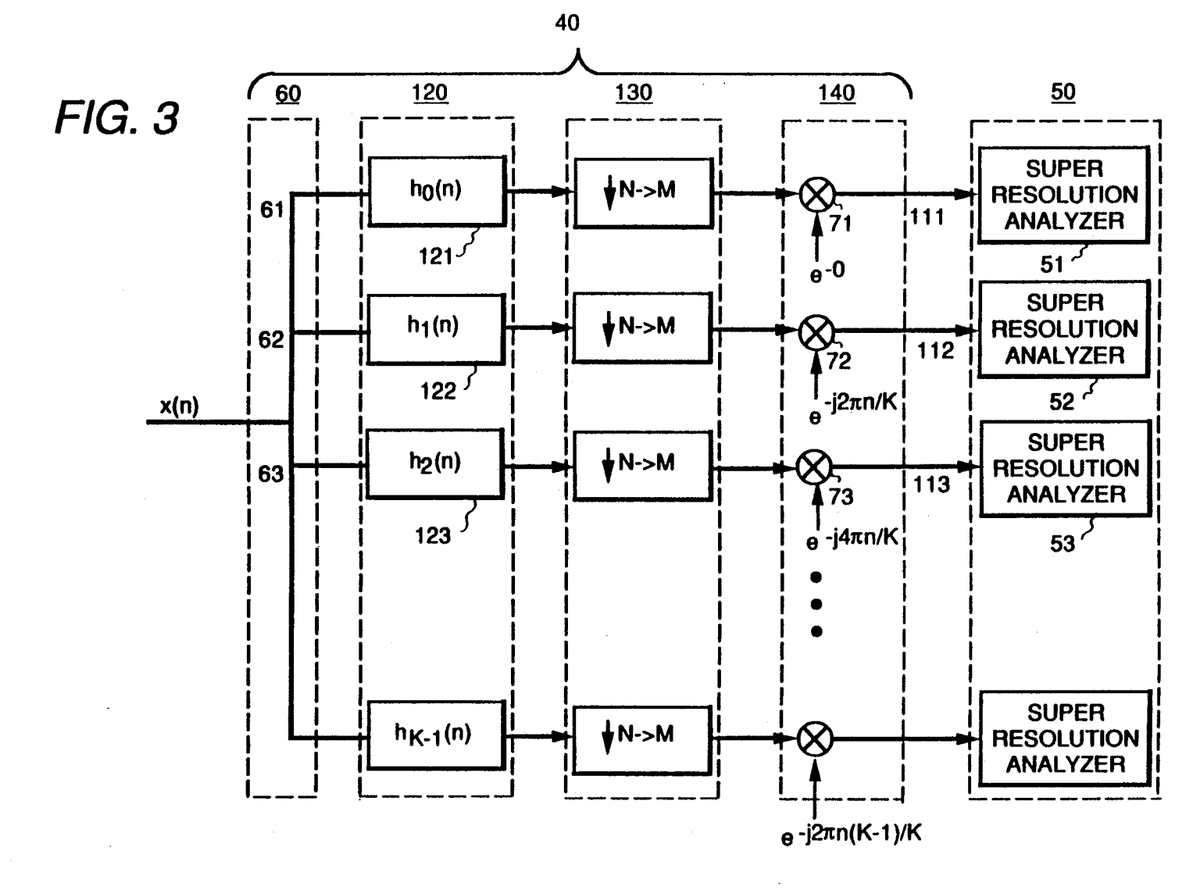
FIG. 3 is a partial block diagram of a second embodiment of the present invention.

An alternative architecture which accomplishes the same end result for the Mth order pseudo aperture array is illustrated in FIG. 3. Here filtering 120 and decimation 130 precedes the modulation operation. This embodiment requires fewer complex multiplications because the modulation operation 140 is performed on the decimated aperture from decimators 130 rather than on the original full length time series array illustrated as input signal x(n). The tradeoff lies in the fact that the embodiment of FIG. 3 architecture requires bandpass filters 121, 122, 123 for each subband that are different from each other. (Note that there are K subbands and parallel branches, but only several are shown here.) Therefore this architecture demands an increase in memory in order to store a set of filter coefficients, used in filters 121, 122, 123.

Figure 4:
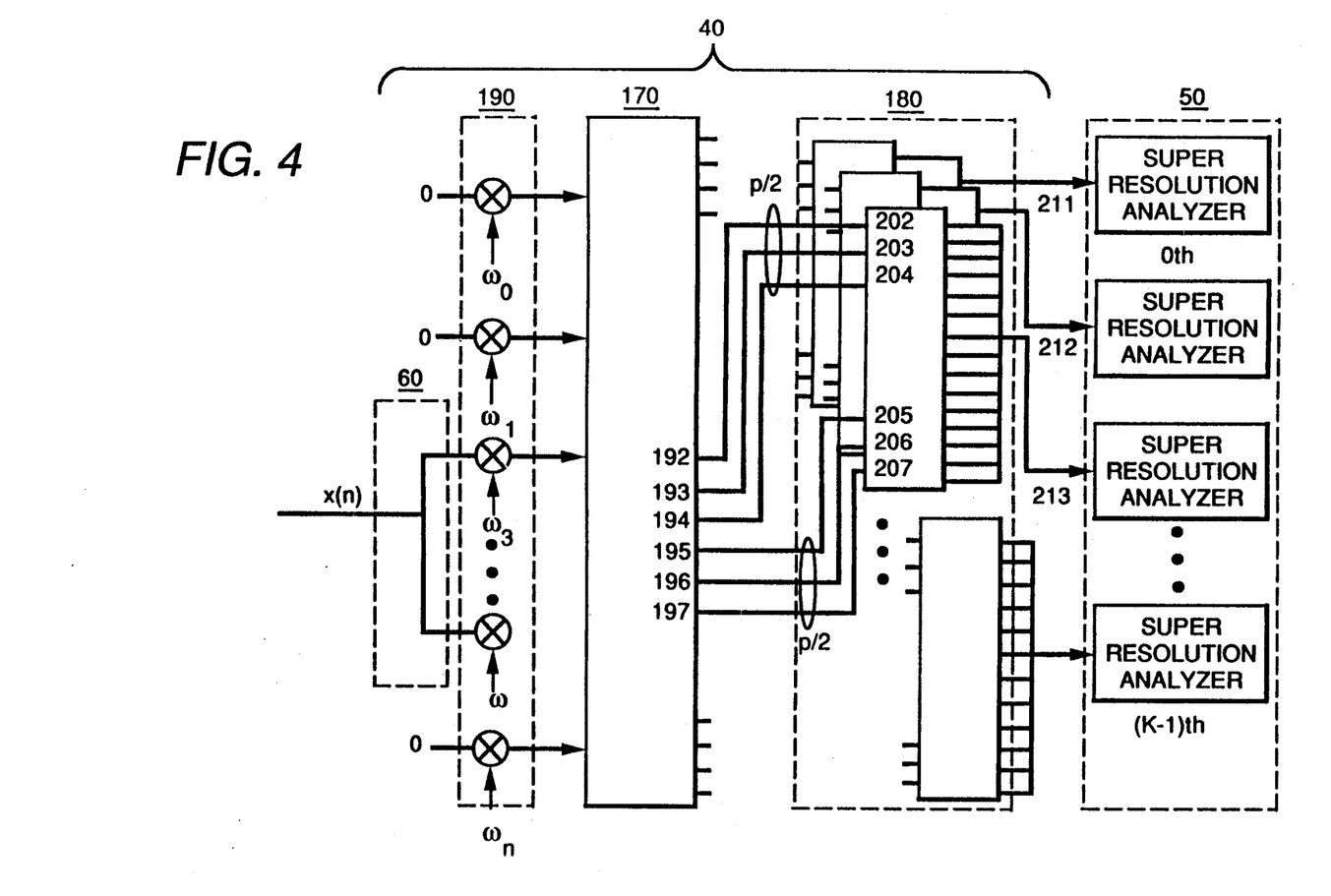
FIG. 4 is a partial block diagram of a third embodiment of the present invention.
Figure 5:
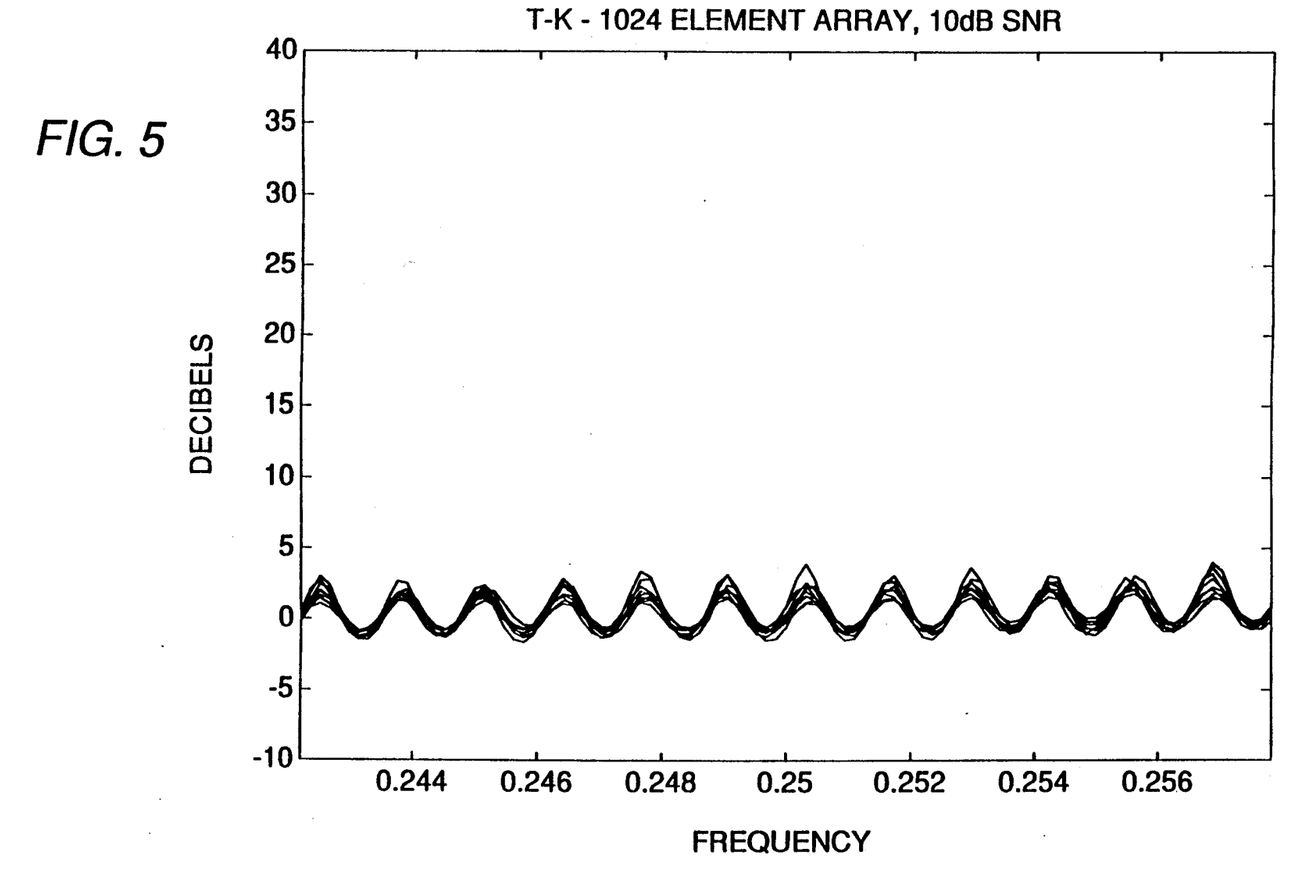
FIGS. 5, 6, 7 and 8 illustrate simulation results obtained for the present invention utilizing the Tufts-Kumaresan algorithm
Figure 6:
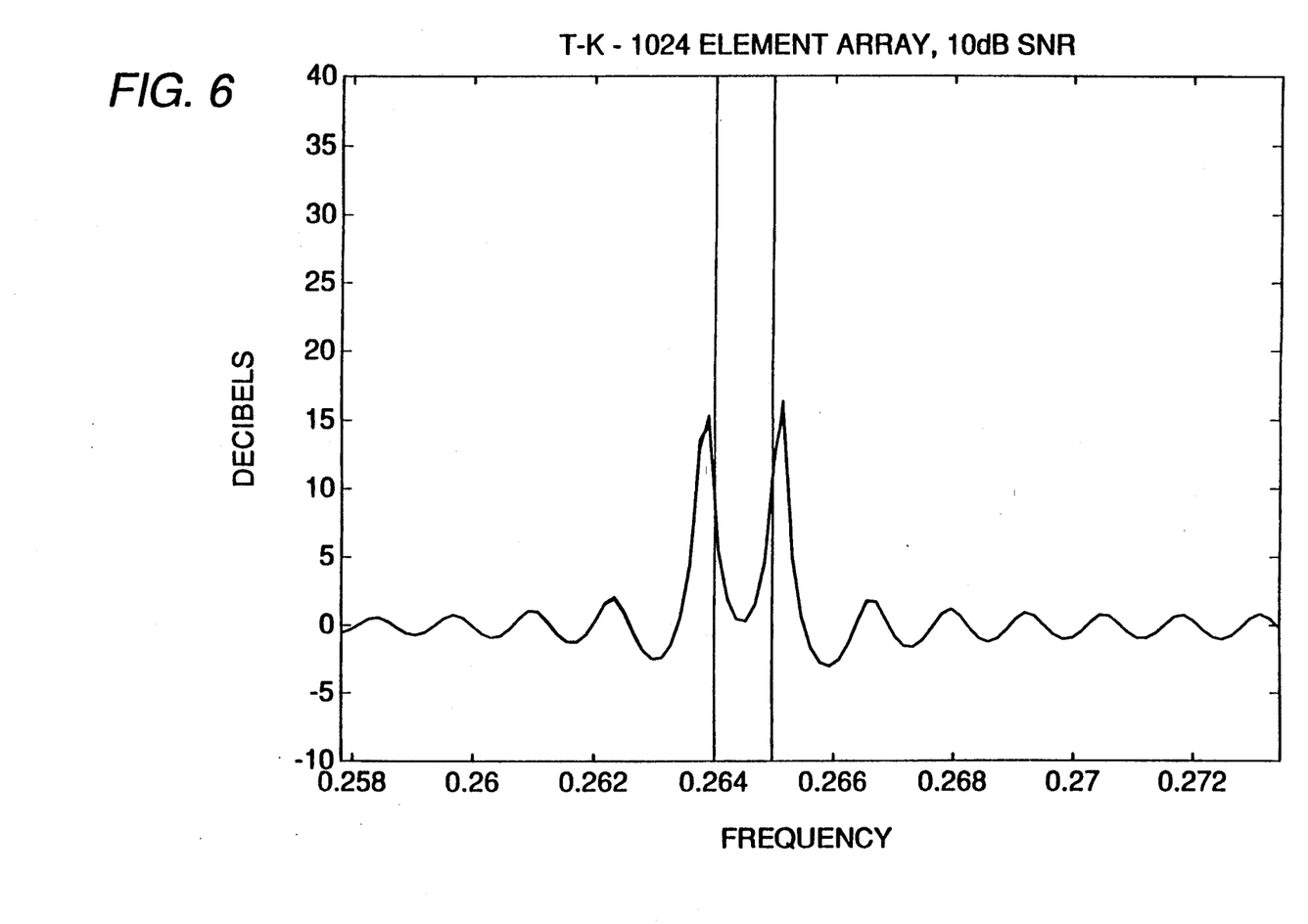
Figure 7:
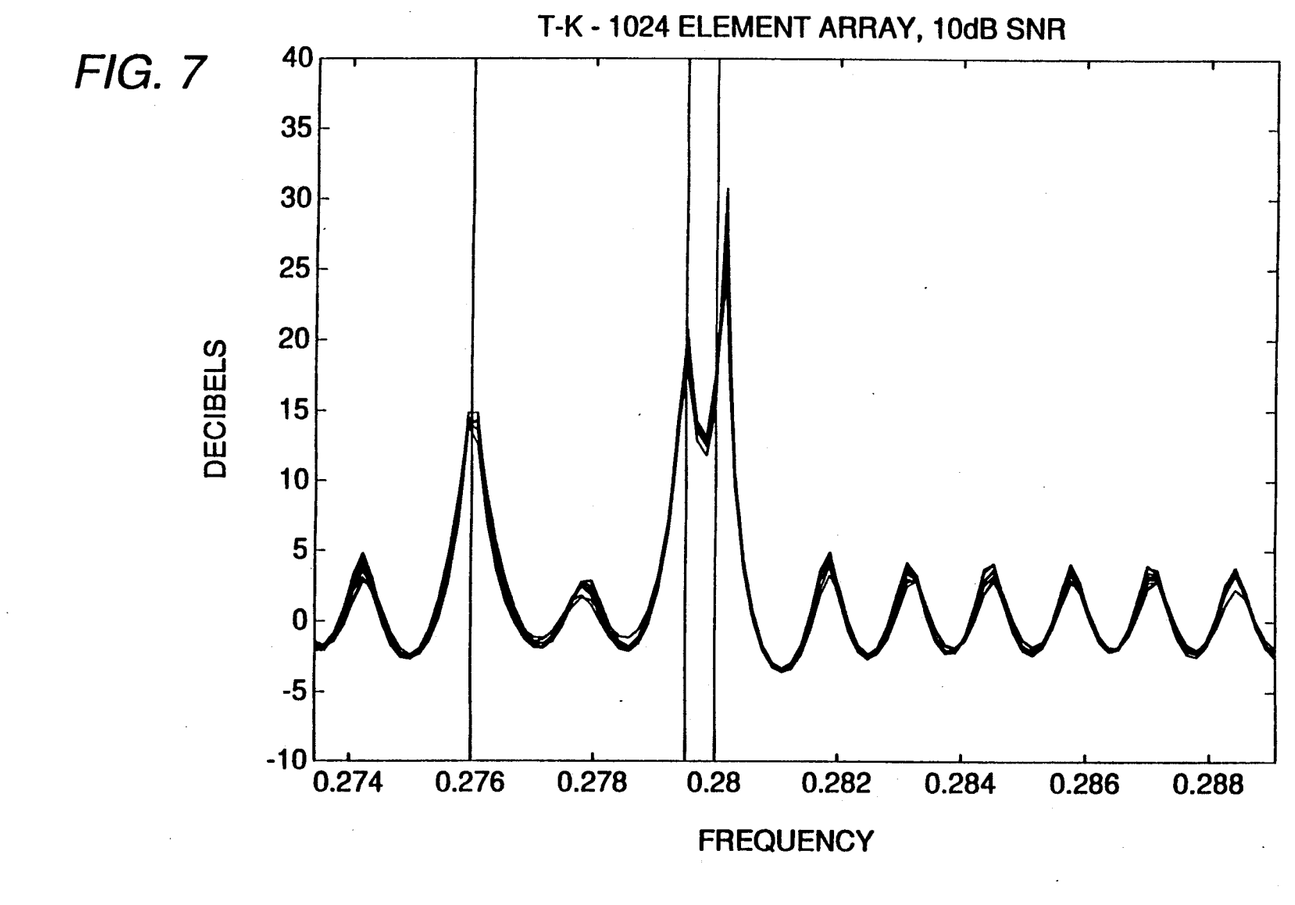
Figure 8:
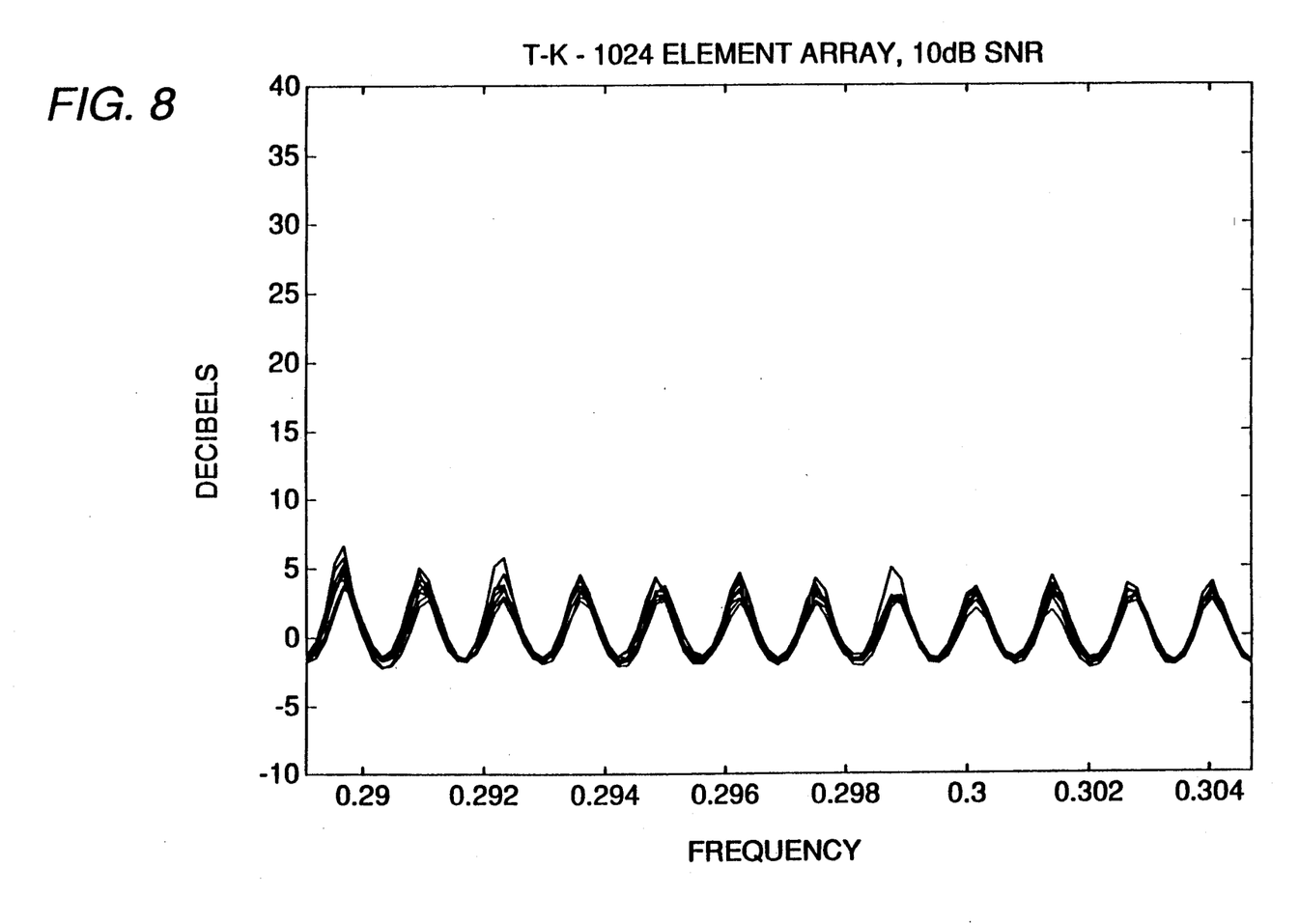
Figure 9:
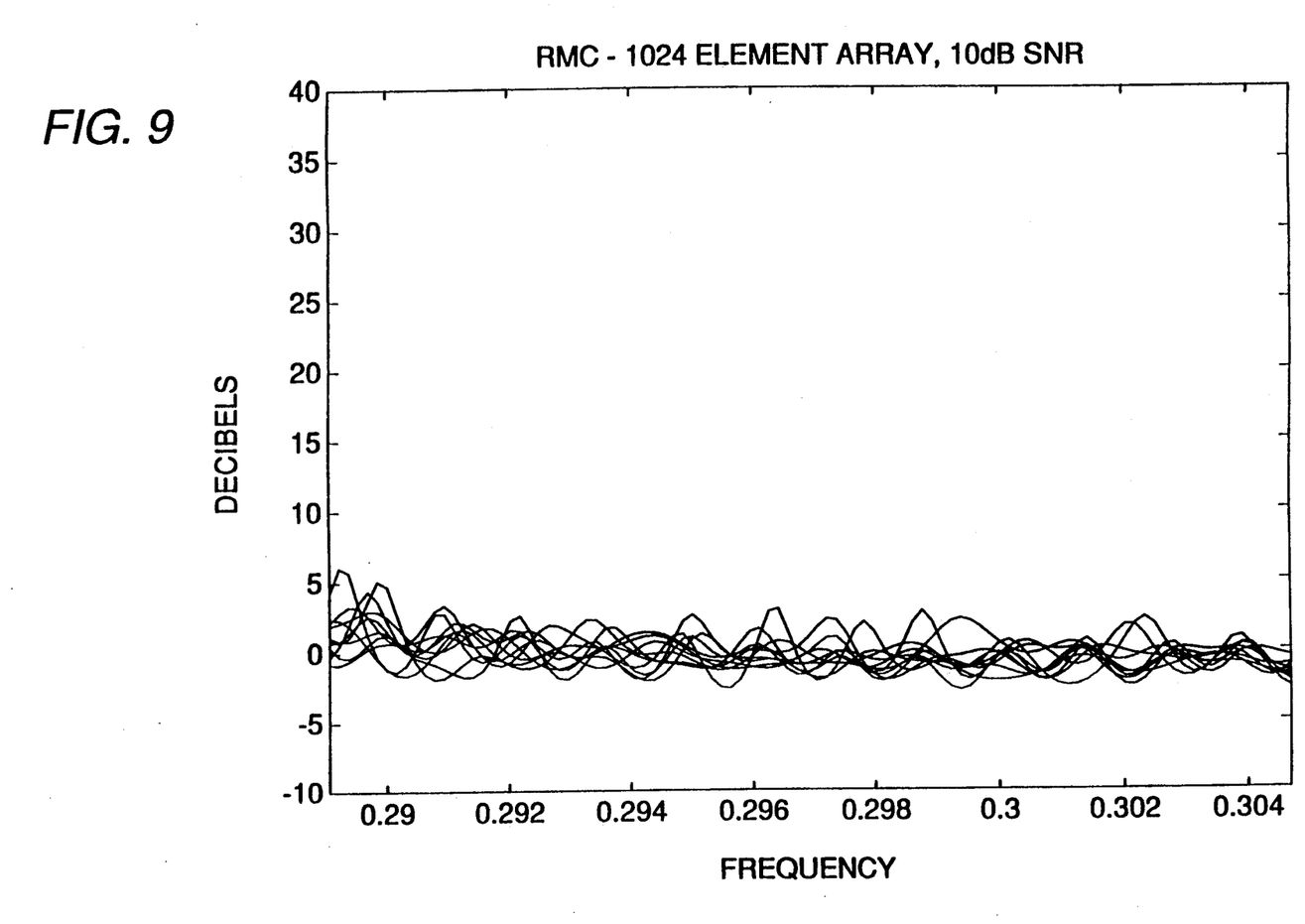
FIGS. 9, 10, 11 and 12 represent simulation results obtained for the present invention utilizing the LMFE algorithm.
Figure 10:
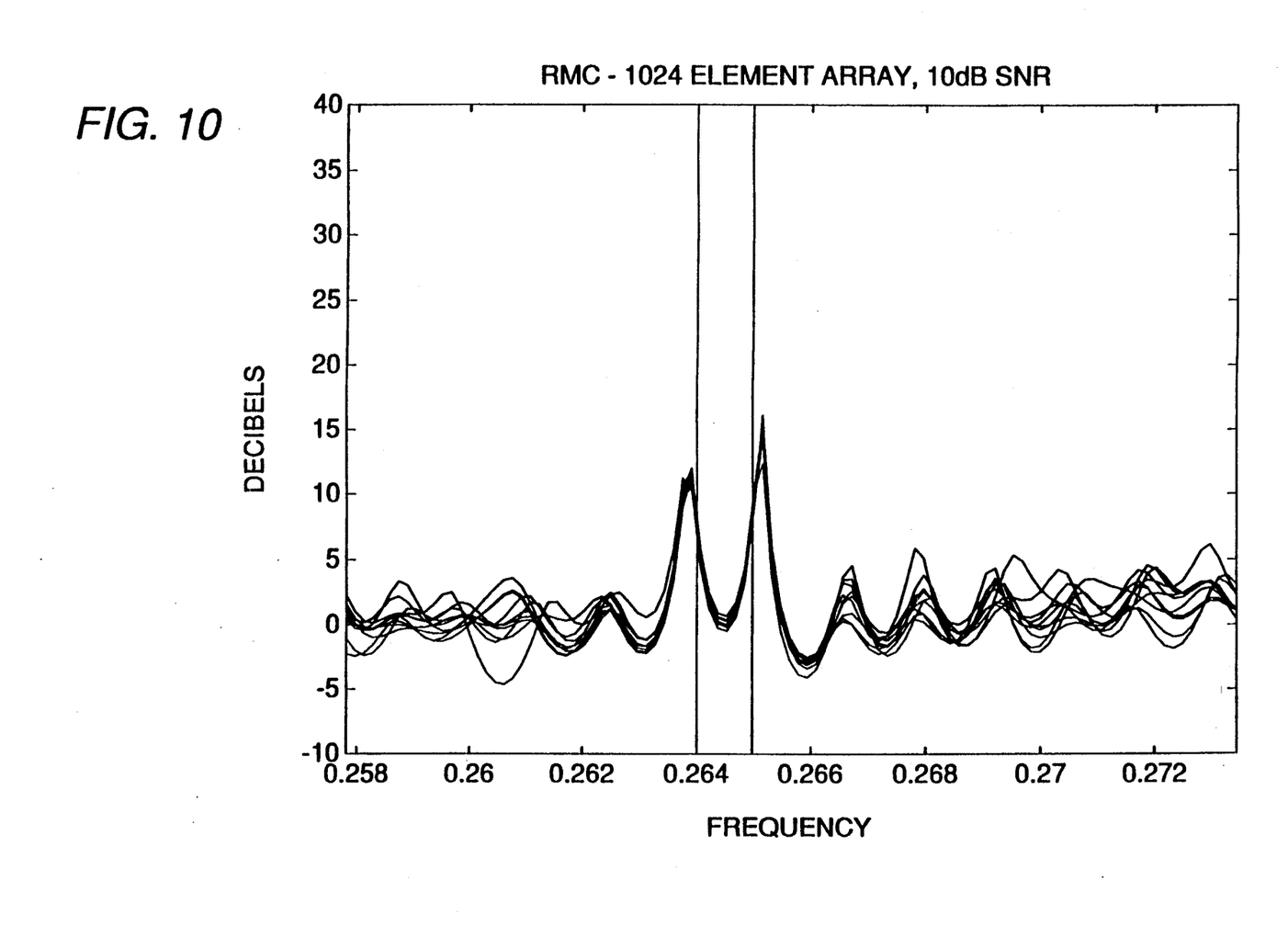
Figure 11:
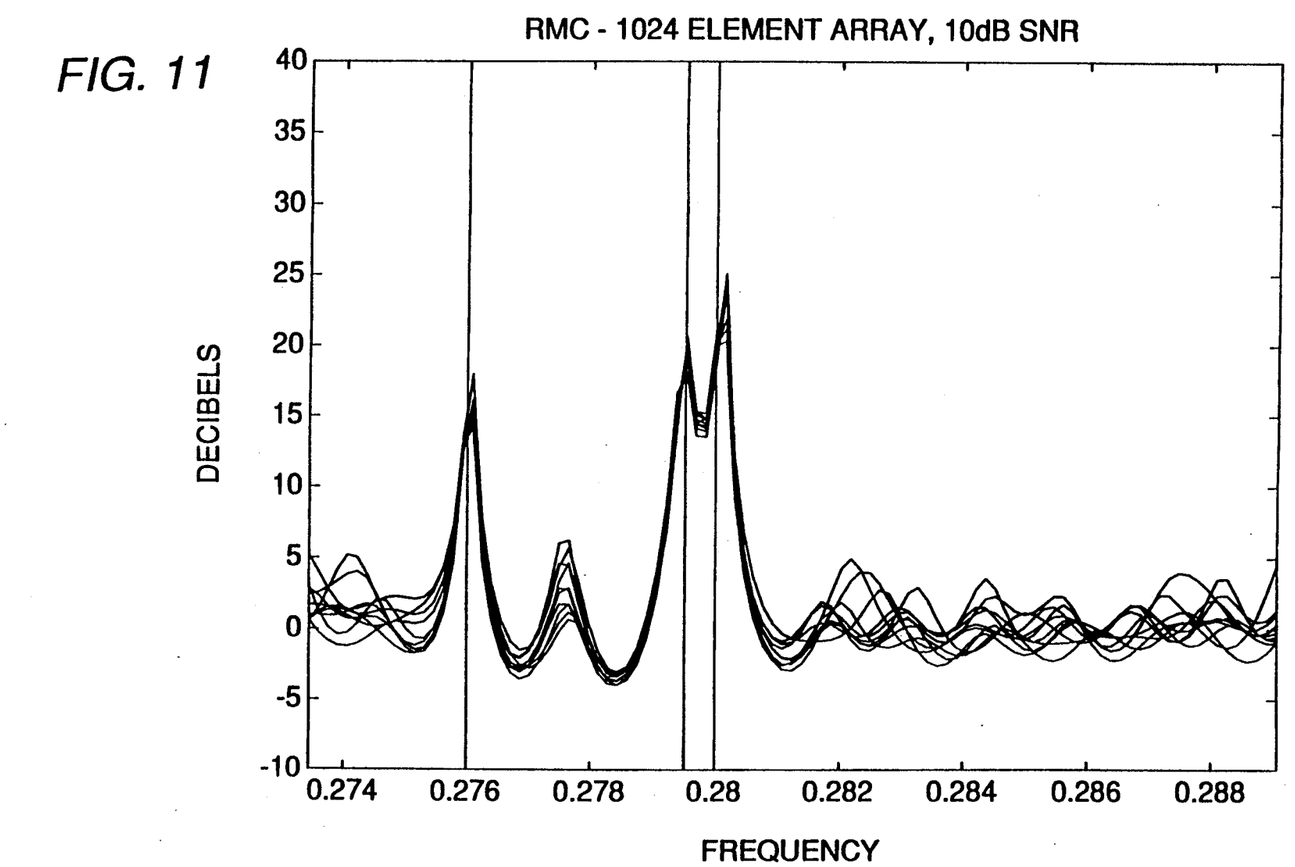
Figure 12:
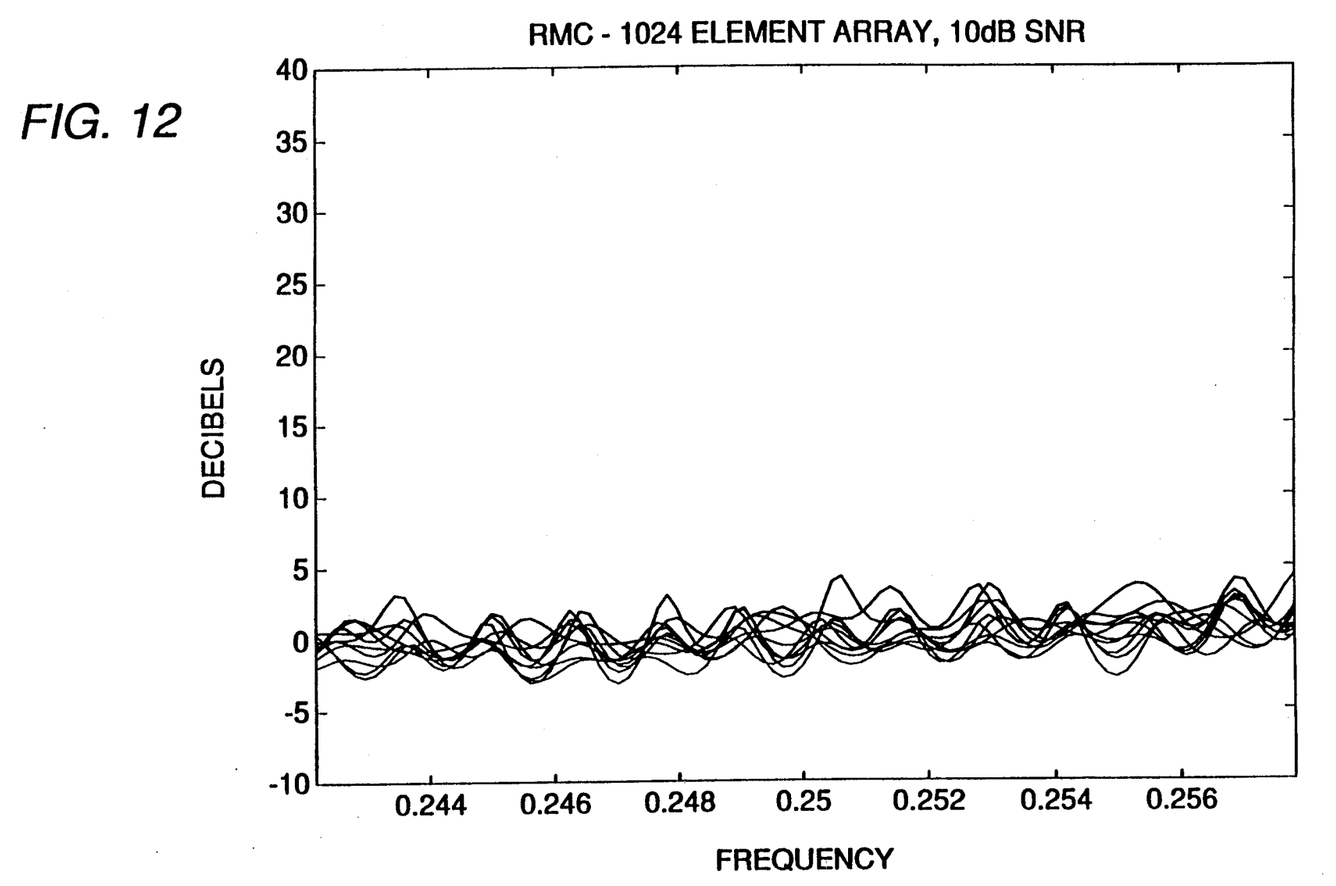

Another embodiment, shown in FIG. 4, is similar to that of FIG. 3 in that filters 120 precede modulation 140, just as filters 170 in the embodiment of FIG. 3 precede modulation 180. The embodiment of FIG. 4 differs from the embodiment of FIG. 3 in that the filters 120 are provided by DFT 170 and inverse digital Fourier transform (IDFT) 180 structures. Each input x(n) may be "windowed" by a window function $\omega(n)$ multiplier 190 prior to being supplied to an Nth order DFT structure 170 to improve sidelobe leakage. In this architecture, N is defined as being a power equal to the nearest power of two larger than the order of the large array. These added input signals are "zero padded" to fill the inputs of DFT structure 170. The output signals of DFT 170 are grouped into K groups of P output signals to form the desired spectral response of a pseudo-time series array 212. Output signals centered at higher frequencies are demodulated to baseband by simply interchanging their index value to the baseband indices. Stated differently, the interconnections between the individual DFT outputs 192, 193, 194, 195, 196, 197 and IDFTs 202, 203, 204, 205, 206, 207 are shifted so that the desired subband is centered about the baseband input signals. The system requires only one Nth order DFT structure 170, but requires K distinct IDFT 180 structures each of width M corresponding to the K desired pseudo-time series arrays.

Decimation is accomplished by simply choosing the set of M outputs of the IDFT structure. As before, we have implemented the steps of filtering, demodulation, and decimation to provide K pseudo-time series arrays each with M complex samples values which are then supplied into the superresolution stage of the spectrum analyzer.

The superresolution spectrum analyzer stage 50 processes the reduced order sampled data sequences from the subbands.

For problems involving line spectral sources, a variety of different algorithms can be used in the superresolution subsystem stage of the analyzer. Time series spectral estimation is usually based upon a single realization of a time series. In the event that data from multiple partially decorrelated time series are available, the superresolution stage can effectively deploy noise subspace analyzers of the generic MUSIC/Root-MUSIC using the MUSIC (See "Multiple Emitter Location and Signal Parameter Estimation", R. O. Schmidt, IEEE Trans. Antennas and Propagation, Vol. AP-34, pp. 276–280, March 1986), or ESPRIT type subspace algorithms, (See "ESPRIT - A Subspace Rotational Approach to Estimation of Parameters of Cisoids in Noise", Roy, R. A. Paulraj, and T. Kailath, IEEE Trans. on ASSP, Vol. 34, 1340–1342, October 1986). For analyzers based upon a single realization of a time series, signal subspace analyzers of the Tufts-Kumaresan (T-K) form. (See "Estimation of Frequencies of Multiple Sinusoids: Making Linear Prediction Perform Like Maximum Likelihood", Tufts, D. W., and R. Kumaresan, Proc. IEEE, Vol. 70, pp. 975–989, September 1982) can be effectively deployed. For scenarios involving continuous as well as line spectral sources, either the non-linear (See "Robust Spectral Estimation: Autocorrelation Based Minimum Free Energy Method", S. D. Silverstein and J. M. Pimbley, Proc. 22nd Asilomar Conf. on Signals, Systems, and Computers, November 1988, "Performance Comparisons of the Minimum Free Energy Algorithms with the Reduced Rank Modified Covariance Eigenanalysis Algorithm," S. D. Silverstein, S. M. Carroll, and J. M. Pimbley, in Proc. ICASSP, Glasgow, Scotland, U.K., May 1989) or linear minimum free energy (MFE) noise reduction extensions of the autoregressive algorithms which have been recently developed by Silverstein et al. above can also be deployed. The MFE extensions of the autoregressive algorithms are the preferred approaches for solving spectral estimation problems because of their inherent ability to resolve combination spectra for situations involving sparse and/or noisy data as well as giving superior performance for replicating the relative intensity of different spectral peaks.

The validity of the architecture has been demonstrated by simulation. The simulations feature large array implementations of the T-K reduced rank modified covariance algorithm; and the linear MFE extension of the modified covariance algorithm. These algorithms are both capable of providing reasonably good frequency estimation performance for single data vectors corresponding to single realization of a time series at moderately low signal-to-noise ratios (SNR's). These algorithms use similar estimates of the autocorrelation matrix based upon minimizing the forward and backward linear prediction error energy. The simulations are based upon a 1024 element array suitably sampled at the Nyquist rate. The simulation test signal consists of five very narrow-band spectral sources represented mathematically by complex sinusoids at frequencies $f_1=0.264$, $f_2=f_1+1/1024$, $f_3=0.276$, $f_4=0.28-0.5/1024$, and $f_5=0.28$. The frequencies $\{f_n\}$ are expressed in units of the Nyquist frequency. The single realization of a time series simulation uses a test signal where the line spectral sources all have equal complex amplitudes, and hence the initial relative phases of the sources are the same. The Rayleigh resolution for this aperture is 1/1024. Hence frequencies $f_1$ and $f_2$ are separated by the Rayleigh resolution, and frequencies $f_4$ and $f_5$ are separated by ½ the Rayleigh resolution. The total signal is taken as a combination of the source signal plus additional uncorrelated random noise which is modeled as complex Gaussian white noise. The SNR is defined in terms of the ratio per element of the source energy for one of the sources to the noise energy per element. The simulations shown here are single coherent realization of time series results (no noise averaging) at a SNR of 10 dB. FIGS. 5, 6, 7, 8 and 9, 10, 11, 12 illustrate the estimated spectra as spectral overlays for 10 spectral estimates of the source signal. Each estimate corresponds to a different realization of the random noise vectors.

The simulations use the parallel FFT/IFFT architecture where FFT's of the 1024 sample coherent aperture are performed. The transformed 1024 element vectors are then divided into 64 32-element "frequency space" vectors commensurate with 50% spectral overlap. The next step involves a 32-point IFFT which automatically generates the decimated data vector for the 32-element pseudo-coherent apertures. In both the T-K and MFE algorithms, twenty-fourth order modified covariance matrices were constructed from the pseudo-time series array data vectors.

The simulation results feature "spectral" constructions for four contiguous subbands. The spectral reconstructions are not true spectra, but rather represent peaks from which line spectral source frequencies can be estimated. FIGS. 5, 6, 7, and 8 illustrate the simulation results for the T-K algorithm. Four contiguous subbands having increasing frequencies are shown in FIGS. 5, 6, 7, and 8 respectively. Similarly, the simulation results for the linear MFE algorithm for four contiguous subbands having increasing frequencies are shown in FIGS. 9, 10, 11 and 12 respectively. The first and last subbands (FIGS. 5, 8 and 9, 12) in each series exhibit no sources. The second subband in the series (FIGS. 6 and 10) illustrates the peaks for the two sources separated by 1/1024, and the third subband in the series (FIGS. 7 and 11) illustrates a single source and two sources separated by 0.5/1024. The actual source frequencies are indicated by the vertical lines in the spectral plots. These simulation results show no sign of any aliasing effects for any of the subbands associated with the spectral regions outside the illustrated domain.

While the architecture has been demonstrated in conjunction with T-K and linear MFE Superresolution algorithms, other superresolution algorithms may also be employed, as mentioned above. Of special interest are the MUSIC and ESPIRIT superresolution algorithms when utilized in conjunction with the embodiment shown in FIG. 4. In this instance, the multiple IDFT structures may be eliminated and their functions provided by the superresolution analysis.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What we claim is:

1. A multi-rate superresolution spectral analyzer for preprocessing coherent time aperture data comprising:

a plurality of parallel branches, each branch having a modulator, a filter adapted to pass a predetermined bandwidth, a decimator, and an output, the modulator of the first branch coupled to receive a signal and shift the signal by a factor of $\exp[-0]$, the modulator of the second branch coupled to receive the signal and shift the signal by a factor of $\exp[-j2\pi n/K]$, where $$j = \sqrt{-1} \; ;$$

$\pi$ is the ratio of the circumference of a circle to its diameter;

n = the index number of the signal sample and

K = the number of parallel branches in the superresolution spectrum analyzer;

the modulator of the third branch of the superresolution spectrum analyzer coupled to receive the signal and shift the signal by a factor of $\exp[-j4\pi n/K]$, the modulator of the Kth branch of the superresolution spectrum analyzer coupled to receive the signal and shift the signal by a factor of $\exp[-j2\pi kn/K]$, and the modulator of the last branch of the superresolution spectrum analyzer coupled to receive the signal and shift the signal by a factor of $\exp[-j2\pi kn(K-1)/K]$;

the filter filtering out selected frequencies of a signal it receives, said decimator being operable to discard selected samples of the signal received from the filter to reduce the number of samples; and the output of each branch being coupled to a plurality of superresolution analyzers used in constructing the temporal signal spectrum from the coherent aperture.

2. A multi-rate superresolution spectral analyzer for preprocessing coherent time aperture data and having a plurality of parallel branches, each branch comprising:

a) a bandpass filter coupled to receive the signal from the coherent time aperture and to filter the signal;

b) a decimator coupled to receive the signal from its corresponding bandpass filter for discharging selected samples of the signal so as to reduce the number of samples;

c) a modulator coupled to receive the signal from the decimator, the modulator of the first branch shifting the signal by a factor of $\exp[-0]$, the modulator of the second branch shifting the signal by a factor of $\exp[-j2\pi n/K]$, where $$j = \sqrt{-1} \; ;$$

$\pi$ is the ratio of the circumference of a circle to its diameter;

n = the index number of the signal sample and k = the number of parallel branches in the superresolution spectrum analyzer;

the modulator of the third branch shifting the signal by a factor of $\exp[-j4\pi n/K]$, the modulator of the kth branch of the superresolution spectrum analyzer shifting the signal by a factor of $\exp[-j2\pi kn/K]$, and the modulator of the last branch shifting the signal by a factor of $\exp[-j2\pi kn(K-1)/K]$; and d) a branch output for sending the signal from its corresponding modulator to an input of said superresolution analyzer for use in constructing an output signal representing said data from said coherent time aperture.

* * * * *